United States Patent [19]

Berkowitz

[11] Patent Number: 4,849,641

[45] Date of Patent: Jul. 18, 1989

[54] REAL TIME NON-DESTRUCTIVE DOSE MONITOR

[76] Inventor: Edward H. Berkowitz, 3633 Ramona Cir., Palo Alto, Calif. 94306

[21] Appl. No.: 64,388

[22] Filed: Jun. 22, 1987

[51] Int. Cl.$^4$ ............................................. G01N 23/00
[52] U.S. Cl. .............................. 250/492.2; 250/492.3; 250/397; 250/398
[58] Field of Search ................ 250/492.21, 492.3, 397, 250/398, 492.22

[56] References Cited

U.S. PATENT DOCUMENTS

| | | | |
|---|---|---|---|
| 4,110,625 | 8/1978 | Cairns et al. | 250/492.21 |
| 4,283,631 | 8/1981 | Turner | 250/281 |
| 4,449,051 | 5/1984 | Berkowitz | 250/492.21 |
| 4,500,790 | 2/1985 | Bretscher et al. | 250/397 |
| 4,517,465 | 5/1985 | Gault et al. | 250/492.21 |
| 4,593,200 | 6/1986 | McGuire | 250/492.2 |
| 4,683,378 | 7/1987 | Shimase et al. | 250/492.2 |
| 4,743,767 | 5/1988 | Plumb et al. | 250/492.2 |
| 4,751,393 | 6/1988 | Corey, Jr. et al. | 250/397 |
| 4,761,559 | 8/1988 | Myron | 250/492.21 |

OTHER PUBLICATIONS

Hammer and Michel, Journal of Applied Physics, vol. 47, pp. 2161-2164, (1976).
Fine and Gordon, Nuclear Instruments and Methods, vol. 149, pp. 679-683, (1978).
Natsuaki, et al., Review of Scientific Instruments, vol. 49, pp. 1300-1304, (1978).
Szajmowski, Vacuum, vol. 34, pp. 285-289, (1984).

Primary Examiner—Carolyn E. Fields
Assistant Examiner—John A. Miller
Attorney, Agent, or Firm—Edward H. Berkowitz

[57] ABSTRACT

A non-destructive ion dose monitor senses instantaneous dose increment in respect of a secondary radiation from known instantaneous coordinates of the ion beam, and a dose image distribution function of workpiece surface coordinates is accumulated in a memory. At intervals, the dose image is compared with a preselected desired dose distribution to obtain a difference distribution function of the ion beam scanning coordinates. The subsequent scanning regime is altered in accord with the difference distribution to cause the sensed dose image to converge with the desired distribution.

23 Claims, 5 Drawing Sheets

REAL TIME NON-DESTRUCTIVE DOSE MONITOR

FIELD OF THE INVENTION

The present invention is in the field of material processing by charged particle irradiation and more particularly related to semiconductor processing via ion implantation.

BACKGROUND OF THE INVENTION

Apparatus for processing of semiconductor materials by ion implantation has been continuously refined in the ability to produce uniform deposition of ion dose over the surface of a semiconductor wafer. Known effects which would alter uniform dose density are compensated in systems which scan the incident ion beam in accord with a waveform selected to effect the desired compensation by homogenizing the scan trace along the path of such trace. Such a system is described in U.S. Pat. No. 4,283,631, to Turner. Another approach ignores inhomogeneity at the level of the individual trace and compensates known nonuniformity (or more generally, deviation from a desired dose distribution) by controlling the density of traces distribution as a function of location on the semiconductor surface. This system is described in U.S. Pat. No. 4,449,051. Optimum deployment of these examples of the prior art each assume knowledge of the actual distribution of which compensation is desired.

Measurement of dose nonuniformity is not unambiguously established on-line in the prior art. Typically, a wafer is positioned in the target plane of a Faraday cage charge collection enclosure with a number (typically 4) of auxilliary Faraday cups equidistantly disposed along the periphery of the workpiece to monitor the beam current during an overscan portion of the scan trace for those traces which intercept these auxilliary Faraday cups. It is apparent that a discrete set of charge integration measurements from peripheral Faraday cups does not establish the does distribution which actually obtains over the wafer surface. This (unmeasured) distribution is assumed in the prior art on the basis of these off-wafer measurements and is properly regarded as an interpolation. It is also apparent that monitoring an overscan requires that a substantial portion of the trace be employed for no other purpose than to serve the monitoring function. A portion of the scan is therefore unproductive with respect to the primary purpose of material processing, resulting in a deadtime interval. Prior art approaches to differential dose uniformity monitoring are described by Hammer and Michel, J. Appl. Phys., v.47, pp 2161–2164 and by Natsuoki, et al, Rev. Sci. Inst. v. 49, pp. 1300–1304.

Accordingly, it is an object of the invention to secure an online, differential non-interpolated measurement of dose distribution during irradiation of a workpiece.

It is another object of the invention to maximize the duty cycle for a beam scanning system by eliminating measurements executed off the workpiece.

It is still another object to provide a closed loop system for conforming the actual dose distribution from an irradiation flux impinging a workpiece to a predetermined dose distribution.

SUMMARY OF THE INVENTION

The above and other objects are accomplished in an imaging system which maps the actual instantaneous deposited dose as a function of time and coordinates, integrating the same to obtain a contour function of measured dose. The measured contour function is compared at intervals with a desired dose distribution and a compensatory scanning sequence (or other dose distributing operation) is executed to bring the actual dose distribution into conformity with the desired dose distribution.

Dose imaging is best accomplished in either of two alternative sensing embodiments. The first of these employs an IR or optical sensor from which a signal is integrated for a selected time interval $\tau < < 1/\omega_s$, where $\omega_s$ is the local scan frequency, and correlated with the time dependent function derived from the scanning control waveform. Thus the IR signal R(t) may be transformed to yield a dose function D(p,q) where p,q are general surface coordinates known from digital deflection waveforms and D is the dose magnitude in the area increment represented by the integration interval located at generalized coordinates (p,q). In a practical realization of this embodiment, the magnitude of D is obtained by a calibration procedure with the IR response for given beam, beam energy, workpiece composition and geometrical considerations. This calibration preferably resides in the memory of computing apparatus from which the particular calibration or like function is loaded to initialize operation.

From an IR (or optical) sensor one obtains a signal which depends upon the instantaneous radiation increment evolved from the wafer at a point on the scan trace. There is a finite instrumental integration over a spatial interval due to the finite lateral extension of the incident particle beam, relaxation time of the sensing apparatus and like instrumental effects. Beyond these ultimate integration contributors, there is usually a desire to obtain a further integration of the sensor signal over a desired spatial extention along the trace. This supports a sufficiently large signal-to-noise ratio in return for the sacrifice of some corresponding instantaneous measure of spatial resolution in the measured image. As the scanning system deflects the beam over the experience, the sensor output signal yields a measure of the beam flux magnitude incident on the workpiece. The scan deflection system generates a sequence of digital coordinates for x and y deflection; these coordinates are converted to analogue form for the purpose of energizing the deflection apparatus, the latter typically comprising electrostatic deflection plates. Consequently the digital coordinates of the instantaneous point of incidence are presently accessible to form an address for storage of the measured sample emanating from that point or locus of points defining the integration interval. Preferably the higher precision coordinates controlling the scan are de facto rounded down to the desired integration interval to yield the desired dose image coordinate for storage. Thus the sensor signal is integrated, converted and added to the cumulative dose image contour as the scan proceeds. Compensation for geometrical and like abberations is discussed below.

An alternate (sensing) embodiment employs a charged particle lens preferentially exhibiting axial symmetry. A sampling of devices of the preferred class of such electro-optical elements would include a retarding analyzer or a cylindrical mirror analyzer (CMA) concentrically disposed about the means central beam trajectory. These well known charged particle optical devices exhibit wide acceptance angle and wide (selectable) energy acceptance for secondary and backscattered charged particles. Furthermore, these devices can be easily configured to accommodate a flux of either secondary electrons or alternatively, backscattered or secondary positive ions. Compensatory functions appropriate to beam, energy, workpiece composition and geometry are readily stored in digital memory for application to the signal developed at a detector disposed at the focal locus of the lens. Such charged particle kinematic (energy or momentum) analyzer apparatus is well known and has been used for surface analysis instrumentation wherein an electron or ion beam is employed to probe the surface composition of a sample and the lens accepts the secondary and scattered electrons (or ions) to analyze the energy spectrum and geometric variation thereof.

A preferred scanning mode CMA incorporates that additional processing employed when the radiating source is located off-axis with respect to the CMA. In the present embodiment the coordinates defining location of the radiating source are known data supplied to the deflection system, preferably in digital form. The more convenient form of operation is based upon the recognition that the deflection system presents a digital value of the coordinates for digital-to-analogue conversion to develop appropriate signals to drive the deflection devices. The digital coordinates are therefore available to the scanning monitor for correction of the signal response of the CMA as a function of the angular interval to the CMA axis from the instantaneous source location. Speed of processing is paramount for real time correction: therefore the off-axis signal response correction is preferably implemented as a tabular array of values arranged in a sequence addressed by a simple function of scan coordinates which are also the image coordinates (matrix indices) of the dose incremental image function (or dose image array). It is ordinarily desirable for the dose image to exhibit resolution consistent with the specified dose homogeneity requirement and the tabular correction entries are similarly distributed.

The signal correction function, which normalizes the off-axis response of the axially symmetric monitor device will normally exhibit elliptic symmetry features which reduce the storage requirements to (very roughly) one-fourth (e.g. a single quadrant) the array size reserved for the dose image matrix. (The asymmetry attributable to inclination of the target with respect to the beam will ordinarily negate exploiting symmetry in order to conserve tabular entries.) The off-axis response is usually a slowly varying monotonic function of the transverse off-axis displacement with rather modest memory requirement. As the scan is in progress the correction factor may be accesses from the known instantaneous scan coordinates and the incremental dose contribution immediately can be corrected as it is added to the dose image array. It is equally appropriate (and preferred) to accumulate the data in uncorrected form and apply the correction factor to the cumulative array elements only when required. The choice is wholly dependent upon processing speed requirements and the need, if any, to have access at any time to the dose contour function in corrected form.

In the present invention, the sensor signal is integrated over a selected elemental coordinate interval and at the conclusion of this elemental integration that integrated signal is digitized. The coordinates which identify the integration interval from which the signal was obtained form the address of a corresponding element of the dose image array where the now digitized sensor signal is accumulated. At intervals during the processing of a workpiece the then current dose image is evaluated by comparison with a model does image (the desired dose distribution) and the result of that comparison controls the necessary modification to subsequent portions of the scanning process in order to more nearly conform the actually observed dose distribution to the model, or desired distribution. This function is discussed further below.

In conventional semiconductor processing, the use of information furnished by the comparison described above contemplates rejection of the entire workpiece (wafer), rejection of a portion of the wafer, or, as preferred, there is employed a closed loop compensatory scanning regime to remedy the defects disclosed by the comparison. Such compensatory scanning may be obtained by differential pattern scanning as described in U.S. Pat. No. 4,449,051, or by a variably shaped waveform controlled scan wherein the waveform shape determines the effective integration of the dose selectively over a desired portion of the scan (see U.S. Pat. No. 4,283,631). The combination of the described processing of the measured dose image with a compensatory scanning arrangement yields a closed loop system which can augment the yield of acceptable wafers or other processed objects.

The result of the comparison of the measured dose contour with an expected or desired contour is recorded and analyzed to detect unusual departures from the desired distribution. The behaviour of the system can be reconstructed from a record of the difference contour and/or from the remedial scanning sequence as the latter develops over the processing of any given wafer. This data may be accumulated over a number of wafers to indicate both normal and unexpected systematic deviations from the desired distribution. Averaged over a number of wafers, a uniform (random) difference distribution is consistent, within tolerance, with proper operation.

DETAILED DESCRIPTION OF THE PRESENT INVENTION

Figure 1:
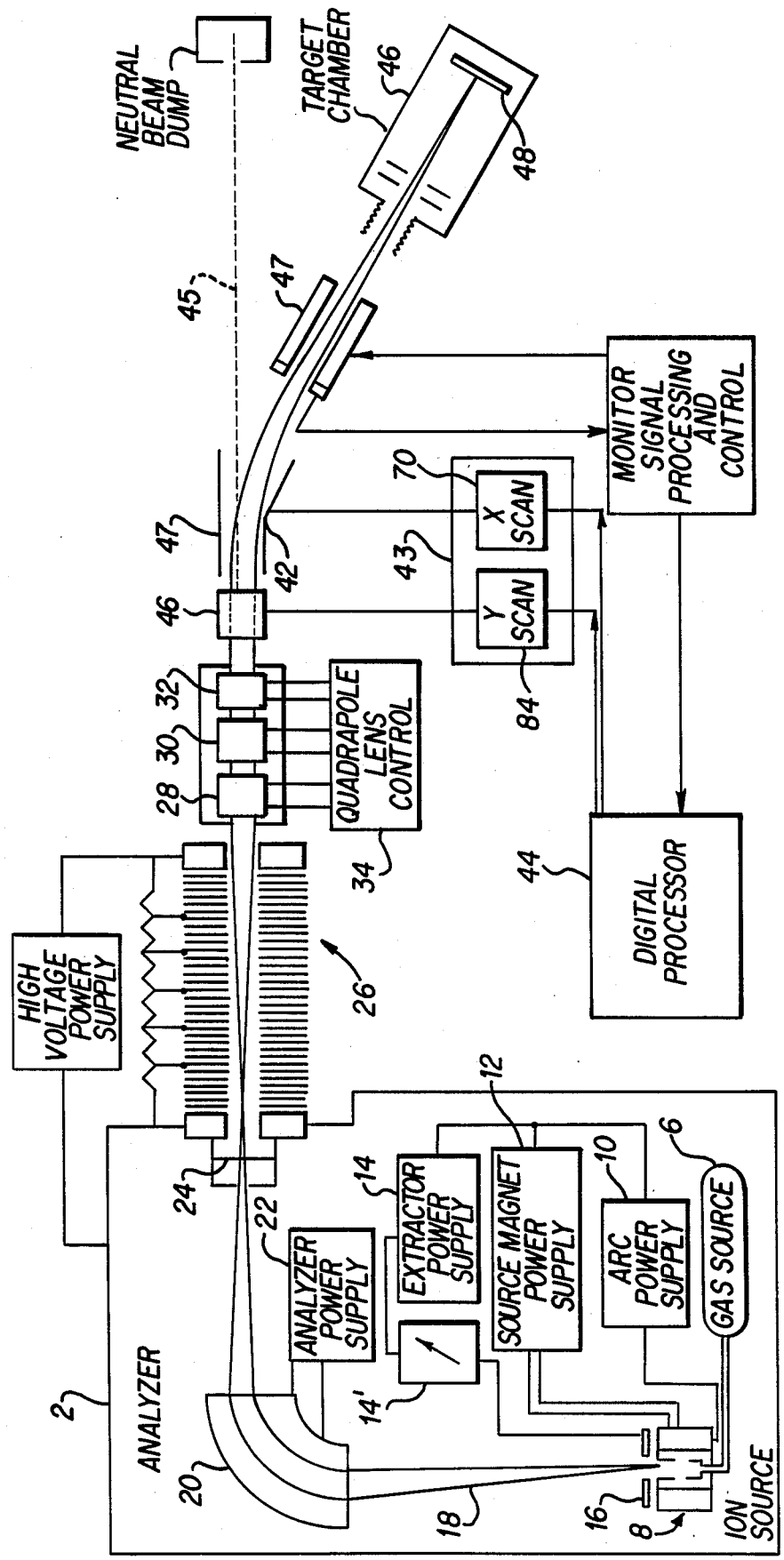
FIG. 1 is schematic illustration of a system employing the present invention.

The present invention is conveniently described within the context of an ion implantation system typical of commercially available equipment, such as shown in FIG. 1. A high voltage terminal 2 is held at high potential, eg 20–400 kev, relative to ground by high voltage power supply 4. Terminal 2 contains the ion source apparatus requisite to formation of a focussed beam of ions of a desired species. In common practice an ion source 8 is provided to ionize a gas derived from gas handling system 6, or to vaporize a solid material. One typical ion source will require a power supply 10 to sustain an ionizing discharge, power supply 12 to impose an axial magnetic field across the discharge region, and extraction supply 14 with vernier 14' to cooperate with extraction electrode 16 to shape the electric field at the aperture of the source to achieve effective extraction of a well-defined high current ion beam from the interior of the source chamber. A more detailed description of ion source techniques is outside the scope of this work. See, for example L. Valyi, "Atom and Ion Sources", Wiley-Interscience, 1978.

The beam 18 diverging from the ion source 8 is momentum analyzed in traversing analyzer magnet 20, the latter energized from analyzer power supply 22. Analyzed beam passes through analyzer exit slit 24 and thence to accelerator tube 26 where it encounters a carefully shaped field gradient from the high voltage terminal through tube 26 to ground potential. A resistive network 19 is conventionally employed in cooperation with accelerating tube apertures to establish the desired axial accelerating field gradient. Electro-optical elements such as, for example quadrupole triplet 28, 30 and 32 and associated control system 34 operate in combination to produce a spatial energy focus at a desired image plane. Two sets of electrostatic deflecting plates, 40 and 42, arbitrarily labeled x and y respectively, serve to direct the beam over the desired area of the image plane. The waveforms applied to the respective deflection plates and their synchronization to form the appropriate scanning program is accomplished by scanning system 43. The control of the scanning program by digital processor 44 is an important aspect of the present invention and is discussed below. The quiescent beam is deflected sufficiently to completely separate the charged beam from the neutral fraction 45 of the beam arising from charge exchange collisions with residual gases. Target chamber 46 contains beam defining apertures, beam monitoring and integrating apparatus, equipment for introducing the wafer or workpiece into the vacuum system and aligning same with respect to the target plane and apparatus for removing heat from the workpiece. This equipment need not be considered in describing the present invention.

Vacuum pumping apparatus and the vacuum envelope of the system are not shown, but it will be appreciated that the entire region traversed by the beam is maintained at high vacuum.

For the gross purposes of FIG. 1, a portion of the present invention comprising a radiation detector is shown at 47 communicating with signal processing apparatus 50. It will suffice to note that this detector is disposed in such fashion to view the secondary radiation emanating from wafer 48. A coaxial geometry for the detector is desirable with respect to the deflected scanning beam not essential to effective monitoring of the dose. Alternatively, a plurality of disrete detectors may be disposed symmetrically about the equilibrium axis of the scan. A single detector may also be employed, recognizing that off-axis corrections will be rather more substantial than would otherwise be the case with paraxial geometry.

In the context of conventional planar semiconductor fabrication, it is extremely important that a high degree of uniformity of ion dose be maintained over the surface of wafer 48 presented for doping and that the time required for such processing be minimal. The present invention is not limited to uniform dose distribution, but is intended to facilitate the achievement of a dose distribution of desired form. The discussion is, however, simplified for the case of a uniform distribution.

Figure 2:
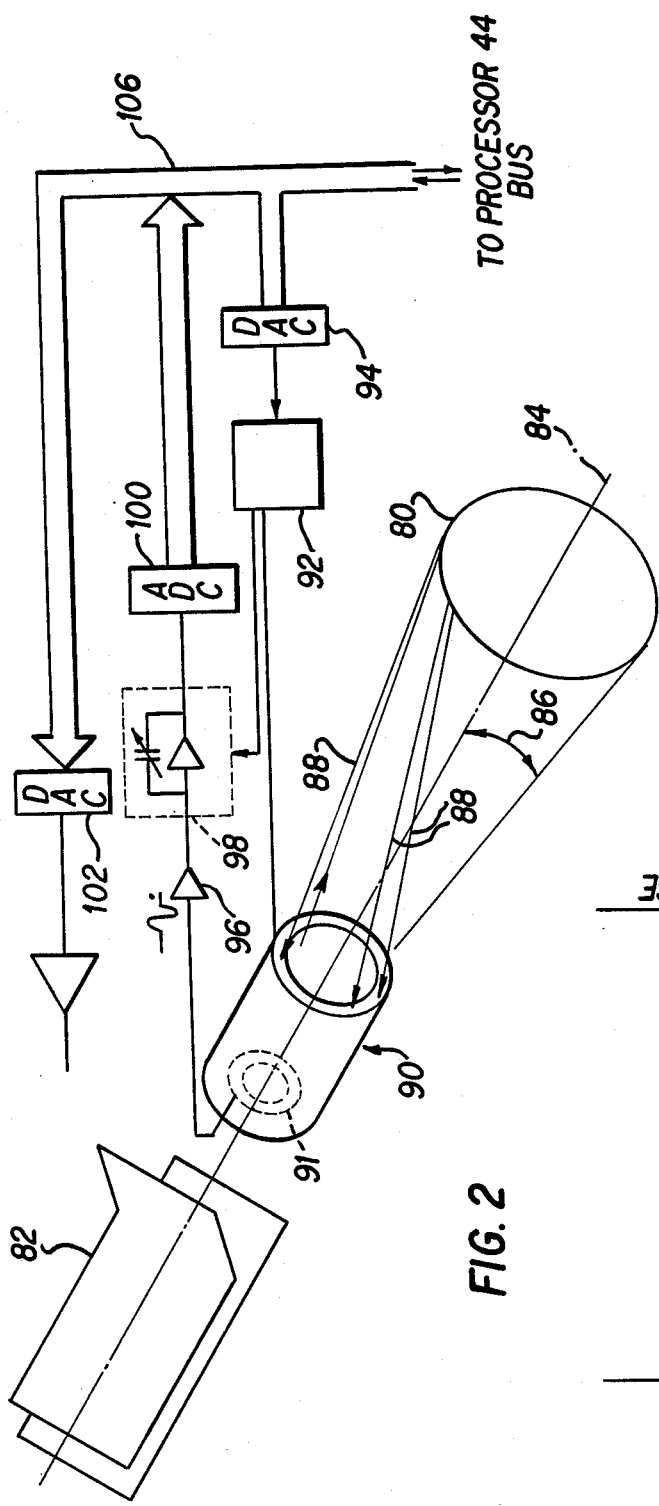
FIG. 2 is a schematic illustration of a portion of the apparatus for practice of the present invention.

Turning now to FIG. 2, a semiconductor wafer 80 is irradiated by a charged particle beam which is scanned over the surface thereof by an electrostatic deflection plate system 82 (only one set of plate shown) which deflects a charged particle beam 83 with respect to axis 84 through an angle 86. The present invention is easily applied to systems which employ other physical principles to distribute the dose over the workpiece in a controlled manner and the discussion in terms of electrostatic deflection is selected for convenience.

Secondary radiations 88 emitted from the wafer in the backward direction impinge a sensor 90. The sensor 90 may be responsive to prompt radiations in the optical or infrared regions, or in another embodiment, to either secondary electrons or to positive ions, as described. Preferably the sensor is of annular construction to fully derive the benefits of axial symmetry and to enable observations at the most extreme backward angles attainable. For charged particles a representative device for the sensor 90 is the cylindrical mirror analyser discussed above. Sensing of electrons, positive ions, optical or infrared radiation (prompt emission) or other indicia (ion induced x-rays and the like) for the magnitude of the beam current impinging the wafer is a choice which may follow from instrumental considerations outside the scope of the present invention. The present invention is applicable independent of the underlying characteristics of the sensor 90. The function of the sensor 90 is to analyze and respond to the secondary radiation (or a portion thereof) with a signal proportional to the magnitude of a selected portion of the secondary radiation flux transmitted through the analyzer (sensor 90). The selected portion may represent a selectably defined energy interval of the spectrum of primary, or backscattered secondary charged particles. Operating parameters of the sensor 90 and associated apparatus 94 may be adjusted by the digital-to-analog converter (DAC) 94 in response to digital parameter(s) supplied by the processor 44. For a CMA, these operating parameters include the radial potential difference between the coaxial cylinders of the analyzer and bias potential for the annular focal plane detector 91. The output of the detector 91 is preamplified and differentiated in preamplifier 96, integrated and further amplified in amplifier 98, digitized and latched in ADC 100. On command, the content of the ADB latch is strobed to bus 106 for processing as described below.

Differentiation of the sensor signal localizes the spatial extent of the source of the signal along the path of the scan trace on the wafer. Integration along the beam trajectory is performed to obtain a satisfactory signal to noise ratio. Integration of the signal over time interval $\Delta t$ corresponds to a coordinate interval $\Delta s$ along the scan trace s thereby establishing the spatial resolution of the digital image of the dose distribution. Control of signal integration as well as signal differentiation are well known aspects of amplifier design and need not be further considered here.

The scanning sequence is controlled by transmission of digital data to DAC 102 with the analog output thereof boosted by output amplifier 104 to drive deflection plates 82. For a complete electrostatic system a similar channel provides deflection data for the corresponding transverse deflection plates. In some commercial systems a second dimension of the scan is provided by relative mechanical rotation or translation. The mechanical scan dimension may be an independent variable: the present invention only requires that the value of the scan variables be established or controlled on-line to correlate with spatial information with the signal derived from focal plane detector 91 of analyzer 90.

The present invention contemplates deriving a signal from analyzer 90 substantially contemporaneous with the instantaneous deflection coordinates as determined by digital data residing in the memory of the processor. That digital data is concurrently available to control a deflection system as above outlined (or to monitor actual mechanical coordinates) and to determine a coordinate of the dose image increment correlated with the scan coordinate and to be represented in digital memory accessed by the processor 44.

The action furnished by the present invention in response to the dose monitoring function is remedial in nature; to modify the monitored dose distribution by further scanning tailored to bring the dose distribution into conformance with a desired form and magnitude. To this end the distribution may be evaluated at some nominal milestone(s) during the processing, the evaluation carried out and the scan resumed with possibly modified parameters to effect the desired modification in the dose distribution. The modification of scan parameters is supplied by the processor 44 operating upon the measured dose distribution $D(p,q)$ in comparison with the desired or model dose distribution $M(p,q)$. The system then generates scan parameters appropriate to the manner of scan compensation (nonlinear waveform, differential pattern scanning, etc.). For the purpose of this specification, a particular set of steps is described to illustrate the operations of the processor in relation to the apparatus and methods here described.

Assume that n evaluation points have been selected at n values (uniformly spaced, for simplicity) over the total desired integrated dose Q and that the scan sequence has reached the $k^{th}$ evaluation point. Assume further that the dose image discloses a dose distribution of the desired shape (within tolerance) differing in magnitude from the desired final result only by the scale factor of k/n. Under such ideal parameters, an evaluation routine operating on such data would resume the scanning sequence without modification. Observed dose magnitude greater (less) than the expected intensity would prompt the evaluation routine to provide for proportionately less (more) scan processing without altering the distribution. Detection of a significant deviation from the desired shape requires compensation as discussed below.

Figure 5:
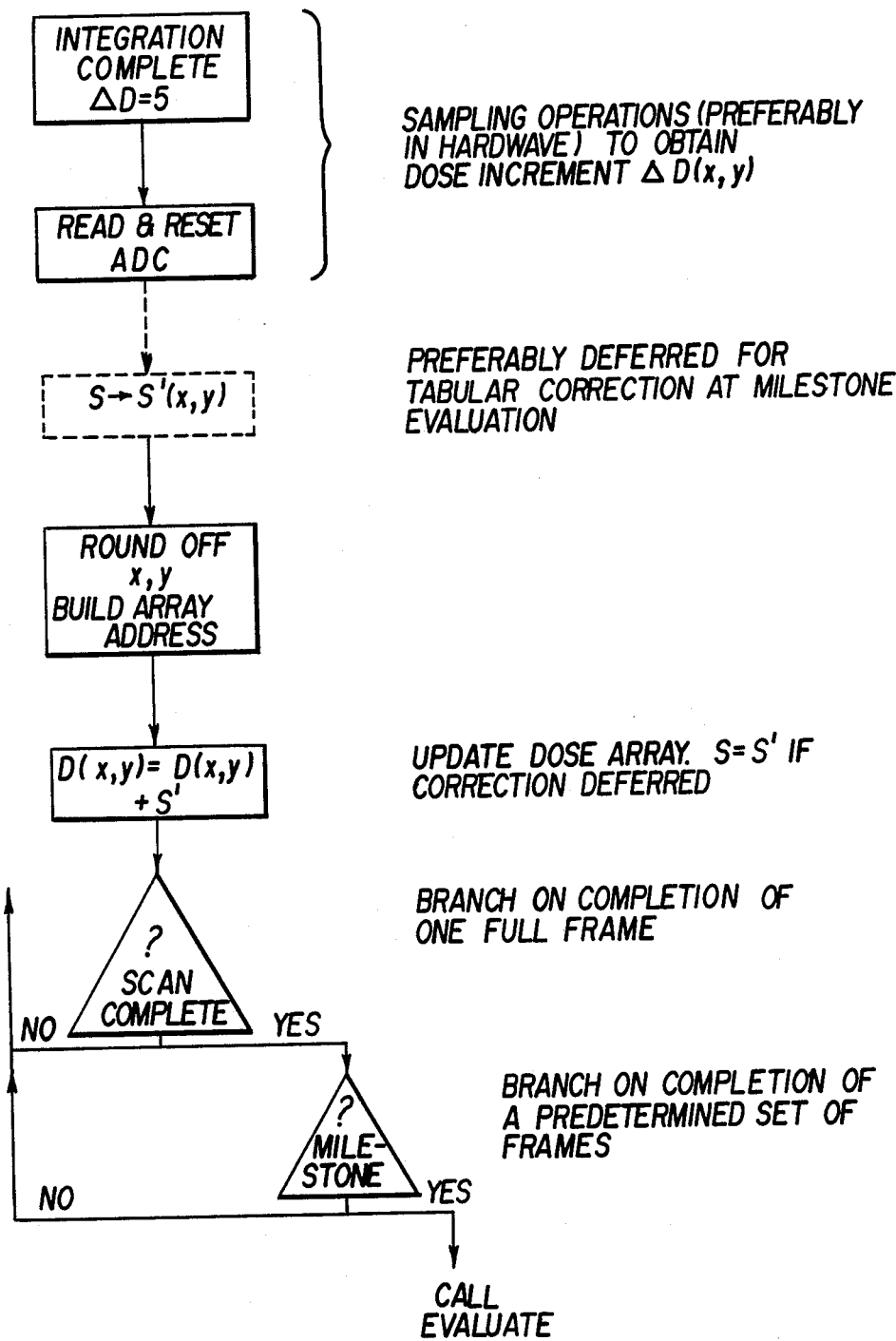
FIG. 5 is a flow chart for a basic data acquisition module.

A portion of the control routine executed by the processor is sketched in the flow chart of FIG. 5. One will recognize that many of these procedures are implemented directly in hardware. The integration control of the sensor signal is established to obtain a satisfactory compromise between signal-to-noise ratio, resolution, off-axis monitor correction and possible scan behaviour over the area of the workpiece. As the scan progresses along the trajectory increment, the signal developed by sensor detector 91 in the form of a continuous current, is sampled and (analogue) integrated over an increment of the trajectory corresponding to a time increment. This is accomplished principally by well known hardware signal processing apparatus represented by block 98. Further digital integration may be performed by hardware counters, and internal digital integration over local regions of the synthesized dose array is achieved by summation over the content of a selected set of adjacent elements of the dose array. The integrated value of the detector 91 signal is converted to a digital datum and the incremental dose $\Delta D(x,y) = \Delta x I(x,y) dy$ is processed together with the value of x and y obtained from the deflection controller (the coordinates rounded to agree with integration interval). The dose image matrix $D(x,y)$ is then updated with the incremental dose $\Delta D(x,y)$. The roundoff of the coordinates x and y is merely another aspect of the signal integration where a plurality of digital values are obtained and summed together for storage at a memory address formed from x and y. The signal response of sensor 90 for signals originating in the integration region at x,y is geometrically compensated by reference to a lookup table. The adjustment of each incremental dose prior to updating the dose distribution matrix can ordinarily be accomplished without incurring undue overhead. Alternatively, the data may be retained in uncorrected form and the aberration correction applied as part of the evaluation procedure. The latter method is preferred to allow availability of the dose array raw data for other purposes to be described.

Figure 3:
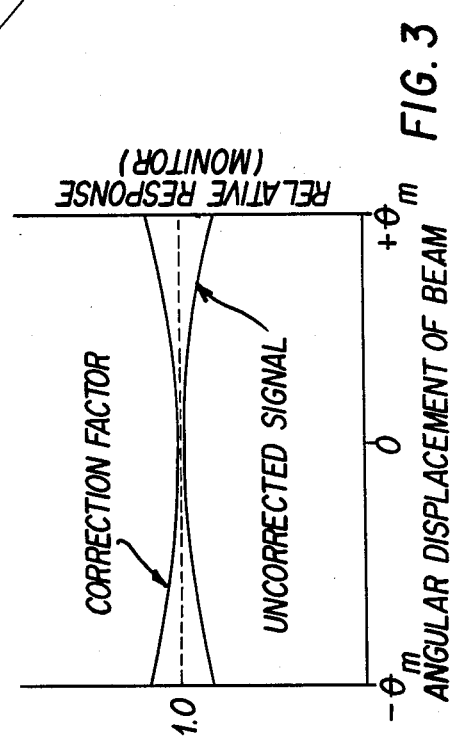
FIG. 3 is an example of optical off-axis response of a sensor and compensation function therefore.

A fanciful illustration of an off axis geometrical aberration is shown in FIG. 3 wherein correction signal 118 is the aberration characteristic of the signal response of sensor 90 to a signal source located at a transverse off-axis displacement x. The lookup table contains an approximation to the correction function 120. It is apparent that the product of signal response function 118 and correction function 120 is a constant by definition.

The lookup table is preferably generated from a master table with due allowance for the actual integration interval selected. In one form of construction this is obtained by monitoring a known distribution, recording the observed distribution and storing same or an analytic treatment thereof in the master table. The construction is most easily executed as in FIG. 3 via numerical means.

Figure 4A:
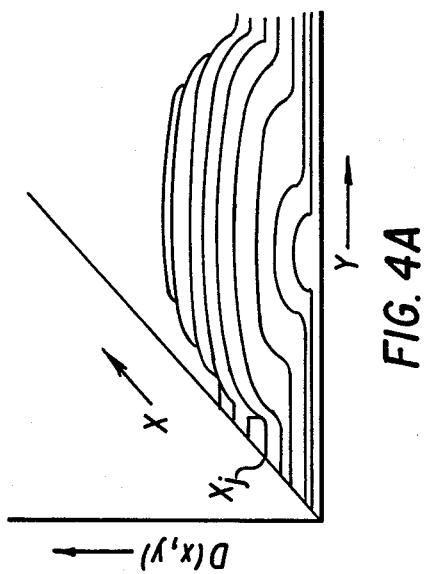
FIG. 4a is a fanciful illustration of a measured dose image array.

Outside of the control loop segment of FIG. 5, or, if desired, in a parallel time sharing context, the accumulated measured dose distribution is compared with the desired or model dose distribution at several stages of processing. The model distribution $M(x,y)$ is stored as a two dimensional array for which the indices correspond to the physical (here, cartesian) coordinates x and y and the value of the model array matrix element represents the dose desired for accumulation in the corresponding area increment. The model distribution may be represented in analytical form or in tabular form, as appropriate, and may be input to the processor from an external data source or retained as a choice of preselected options. The comparison is executed in straightforward fashion and the result is preferably retained in auxilliary memory for diagnostic analysis of equipment performance as discussed below. A simple example is considered with the aid of FIGS. 4a and 4b where an exaggerated measured dose profile $D_x(y)$ is sketched for a given value of x. The scaled model distribution $\alpha M(y)$ is the desired shape and magnitude of the dose distribution scaled to the then current stage of processing. Both $D_x(y)$ and $M_x(y)$ are clearly slices of the corresponding arrays. A convenient scaling factor $\alpha$ may be obtained by summing (integration) of the measured dose array and taking the ratio to the area under the corresponding model distribution. Alternative techniques for obtaining a suitable scaling factor will be appropriate for particular processing.

Figure 4B:
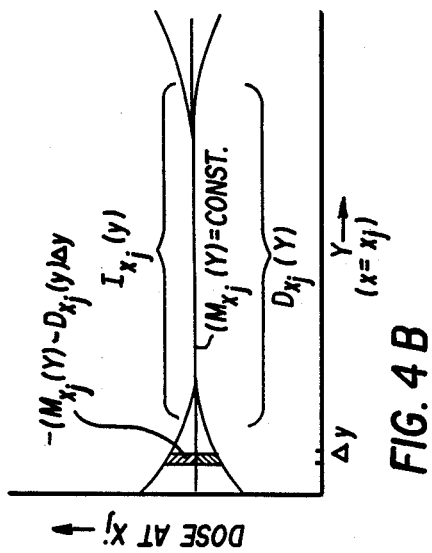
FIG. 4b shows the dose distribution $D_{xj}(y)$ corresponding to a slice at $x_j$, a corresponding slice $M_{xj}(y)$ of the model array $M(y,x)$, normalized thereto and the resulting dose correction $\Delta_x(y)$.
Figure 4C:
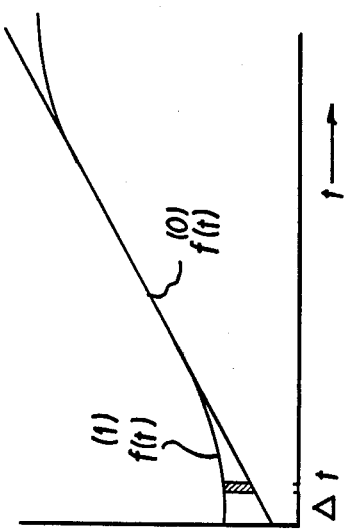
FIG. 4c shows the relationship of a nonlinear wave form obtained from $\Delta_x(y)$ together with an ideal wave form for $M_x(y)$.

Turning now to FIG. 4b the difference of the measured distribution to the expected distribution is obtained and the difference is reflected about the expected distribution to explicitly exhibit the distinct error function relative to the model distribution. This resulting error function, so represented by the set of numeric data, forms an empirical weighting function for application to a deflection waveform $f^{(0)}$ of a (presumed) constant beam current, eg. a deflection waveform in the y direction for the given value of x. The reciprocal of the scale factor determines to first order, the number of repetitions of this waveform then remaining in order to achieve the model distribution. A complete prescription for the succeeding scans is therefore obtained in this way to continuously implement the nonlinear waveform appropriate to dose compensation.

Compensation in the differential pattern scanning method is also obtainable in the simple example given above. The incremental density of traces is simply proportional to the error function described above. Workers skilled in the art will note a relationship between these methods based upon a mathematical relationship of functions governing the respective dose controlling techniques. Examples of compensation from dose difference data following each of these methods are discussed below.

Difference data (obtained element by element as the difference between $M(x,y)$ and $D(x,y)$ is a simple and direct means for constructing remedial or subsequent scans. Assume that the difference data is organized or may be transformed to correspond to sequential intervals along the scan trajectory. This is most easily discussed in terms of rectangular scan coordinates but there is no limitation implied for any particular choice of coordinate systems. For $x=x_i$ in the scan $y_o < y < y_{max}$ the quantity $D(x,y_i)M(x,y_i) \neq 0$ constitutes an anomaly which it is desired to compensate in subsequent scans.

For a tailored waveform deflection system it is only required to adjust the waveform shape which controls the trajectory time dependence along the trace to compensate the difference between model and measured distributions. In the case of a uniform distribution, the desired constant dose density represented by $M_x(y)$ is achievable, in principle, with a constant scan rate $$\dot{y} = dy/dt = \text{const}$$

The error function $\Delta_x(y)$ is applied to the scan function through a transformation process to obtain a new scan function by the interactive procedure. Because the waveform can be reconfigured rapidly, a substantial difference in waveform can be supported between consecutive adjacent scans where required. Using FIG. 5 as an hypothetical example, a simple approach is given as illustrative of processor activity for the practice of the invention. An evaluation is triggered at some intermediate stage in the processing. The triggering event is typically based upon the dose accumulation compared to a pre-selected set point(s). For a given scan trajectory y(t) at a given value $x=x_i$, the measured distribution is assumed to differ from the desired (scaled) distribution in shape. For this value of x the final distribution will inevitably take the form $D_x^{(n+1)}(y) = D_x^{(n)}(y) + \Delta_x^{(n)}(y)$ where the index n refers to the evaluation point in the processing. It is desired to so configure the evolving difference function $\Delta_x(y)$ for the remaining portion of the processing so as to secure the desired final distribution. Further processing required to reach the desired criteria is roughly measured by $\alpha$. These further raster repetitions are ordinarily interspersed within scan trajectories for other wafers undergoing the same processing. The waveform required to yield $1/\alpha \Delta_x(y)$ is to be determined.

Figure 6:
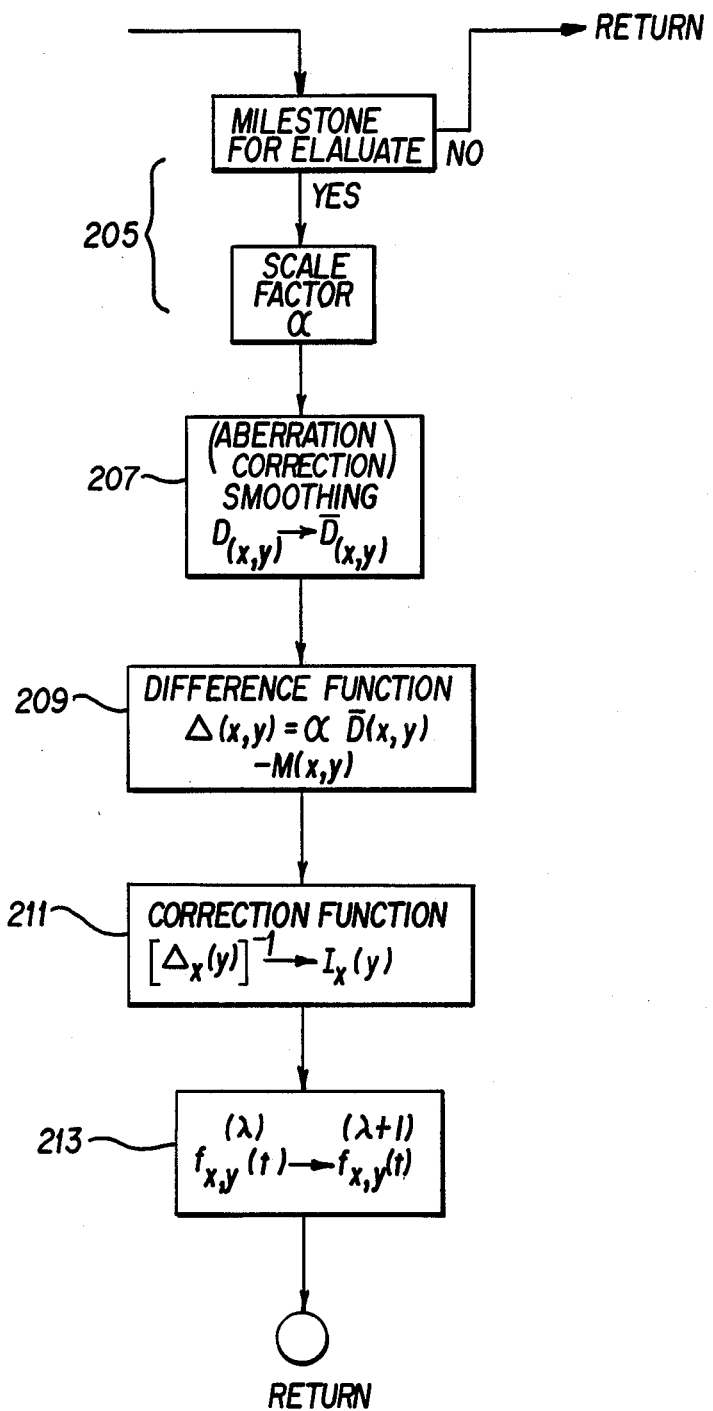
FIG. 6 is a flow chart for a representative EVALUB routine.

The operations described above are discussed with reference to the flowchart of FIG. 6 representative of processing which is advantageously employed for remedial modified scanning in a closed loop system of the present invention. This description is necessarily specialized to particular apparatus but the kernel of the processing is more widely applicable.

The EVALUB function is invoked at block 205 after detection of selected criteria. A typical approach simply spaces the EVALUB execution at equal intervals of total accumulated dose determined by Faraday cup charge collection or determined from integration of the dose distribution obtained from sensor 90. Nonlinear spacing of execution of the EVALUB function (logarithmic, exponential or like spaced intervals) assured greater precision convergence toward the desired dose distribution and such spacing is preferred.

In the example of FIG. 6, the two dimensional dose distribution data are subject at functional block 207 to smoothing and/or averaging operations to assure that statistical artifacts are not misinterpreted as physical aberrations requiring remedial scan correction. This is preferably undertaken in a separate array $D(x,y)$ so as to preserve the measured data in its unprocessed state. Smoothing and averaging of data arrays are well known operations within the art. A separate D array is not a requirement of the invention and will be understood in what follows, in proper context, to refer to a desirable step in the processing.

The data $D(x,y)$ are compared to the model distribution $\alpha M(x,y)$ where $\alpha$ is a scaling factor established at functional block 205. The two dimensional difference function $\Delta(x,y)$ is obtained at block 209 and decomposed to correlate with the distinct scan geometry. (It is not essential that remedial scans be referenced to preceeding scan geometry. An example where a significant departure is practical would be the use of an oblique axis raster scan in combination with a cartesian scan. This type of change in scan geometry is easily accomplished and may be especially desirable for smoothing or to avoid pattern artifacts, Moire patterns, Lissajous effects and the like). An example of an extreme change in scan geometry would be the use of a spiral scan for partial compensation of the dose produced by an earlier rectangular raster scan. It is expressly recognized that the symmetry of the difference functions $\Delta(x,y)$ can be analyzed and an appropriate compensatory scan geometry applied. For the purpose of this exposition it is assumed for simplicity that the scanning geometry does not change appreciably for the compensatory or remedial scanning.)

Consider now a preferred strategy for empirical construction of subsequent scans to compensate a detected deviation from the desired dose distribution. The technique is applicable to a wide variety of desired dose distributions M(x,y) but it will suffice for illustrative purposes to assume that M(x,y)=constant, a planar uniform distribution and further assume, for simplicity, a cartesian scan geometry.

For specificity it will be assumed first that compensation is to be implemented following the taylored waveform shape technique described by Turner. Without particularizing to the particular compensation approach, FIG. 4b shows a slice at a value of x for both $M_x(y)$, $D_x(y)$ and the difference $\Delta_x(y)$. To normalize D (x,y) to M (x,y) for all x, a global scale factor may be obtained as $$\alpha = \frac{\int\int M(x,y)\, dx\, dy}{\int\int D(x,y)\, dx\, dy}$$

For a different slice $D_{xj}(y)$ the factor $\alpha$, so defined determines the scale of the compensation function at coordinates y. (Local scale factors $\alpha(x_j)$ can be defined in straight forward fashion, if desired. Such practice is best suited to instances of extremely asymmetry or fast changing dose distributions.) As described above, the two dimensional difference function $\Delta(x,y)$ is reflected in the surface M (x,y) and M(x,y) is subtracted therefrom to yield a set of empirical forms $I_x(y)$ which may be employed to correct the prior corresponding scan function(s) F (t). In this manner the dose distribution function may be forced to converge by superposing corrective terms on the scan (whether by density of traces, taylored waveform or other compensating technique).

Now consider for specificity, a taylored waveform compensation system. At the evaluation point where the difference function of FIG. 4b obtains.

$$\frac{1}{\alpha} M_x(y) = D_x(y) + I_x(y)$$

The dose $D_x(y)$ has been achieved in prior scans and in the remaining portion of the processing, the scan waveform F(t) will be given by $f^{(0)}(t)+f^{(1)}(t)$ where $f^{(0)}$ is the prior waveform and $f^{(1)}$ is a correction obtained from $I_x$ (y) for each x. That is, F(t) obtained from the prior evalaution milestone is treated as the approximation $f^{(0)}(t)$ for the iteration obtained from the next evaluation. An empirical technique to generate $f^{(1)}$ *is to consider the incremental dose to be deposited in the interval $\Delta y$ which is given by $I(x,y)$ $\Delta x \Delta y$. From FIG.* 4c, the waveform increment is adjusted to deliver this increment in an interval $\Delta t$. Accordingly the relationship is expressible as $$\left[\frac{1}{\alpha} M_x(y) - D_x(y)\right] dy = f^{(1)} dt$$

It is clear that $f^{(1)}$ for the present iteration is the function which alters the amplitude of $f^{(0)}$ *(t) at each interval y(t) in proportion to the deviation represented by difference function $\Delta_x(y)$ and* the transverse scan projection rate dy/dt. When, as shown in the example of FIG. 4b, the deviation is positive (local dose surplus), the dose must be augmented. This is accomplished (in the approach taught by Turner) through increasing the dwell time of the projected scanned beam in this region by altering the shape of F(t) in that region.

Figure 7:
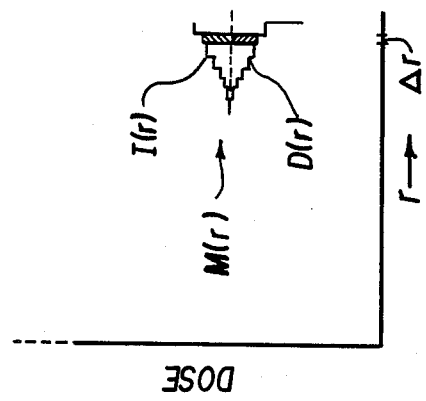
FIG. 7 schematically represents one effectuation of a density-of traces dose correction function.

To drive a density of traces compensation system, one typical algorithm for use in combination with the dose array difference function $\Delta(x,y)$, can be described with the aid of FIG. 7. FIG. 7 schematically represents a radial dose distribution difference function and the corresponding error function. A radial correction function increment is obtained as a radial trace density function corresponding to $$I(r) = D(r) - M(r)/\alpha$$

It is apparent that difference functions exhibiting polar symmetry are particularly easy to remedy because of their effective single parameter character. Somewhat asymmetric difference functions are suited to compensation in this general approach by "precessing" an average error function over an appropriate angular increment.

The design of system parameters for the empirical error function compensation, as described, is preferably obtained by simulation techniques which are well known numerical methods.

In implementing either empirical error function treatment as discussed above, the precision with which the correction functions $f^{(1)}$ are described usually does not require shape specification as detailed as for the dose array D (x,y) itself. It is good practice to reduce the precision of the error function as much as will permit achievement of the desired dose distribution within tolerance.

In carrying out the evaluation and compensation analysis as above described, computational overhead may make it useful to carry out the evaluation on the basis of a D (x,y) which contains an extrapolated component with some further complete scans to overlap processing with evaluation computation time. The calculations are carried out during the interval represented by the extrapolation whereby overhead in processing is significantly reduced or allocated to occur in parallel with dose deposition.

It remains to summarise that for simple waveform remediation the distribution q(y) may be regarded as $$q(y) = \left(\frac{dq}{dt}\right)\left(\frac{dt}{dy}\right)g(y)$$

where dq/dt is the beam current, dt/dy depends upon the waveform and g(y) contains spatial dependences due to geometric or related effects. Precise a priori knowledge of g(y) is not required. The present system will tend to adjust dt/dy to reduce the difference between $\int q(y)dy$ and a model or reference distribution. While it is assumed that dq/dt is constant, it is apparent that the present invention will attempt to correct such transient idiosyncracies as exemplified by beam current fluctuation. Whether or not these fluctuations are isolated or periodic, erratic or reproducible, the effect upon differential dose distribution is monitored and the source of the dose deviation need not be known for effective correction to be implemented. However, to the extent that compensation is required, the efficiency of the processing operation may be effected and empirical modification of the dose controlling means to produce a more nearly correct distribution without undue compensation is desirable. To this end it is preferred that raw dose data be retained as obtained form sensor 90. This data is preferred for retention, best in a parameterized form to produce a log of dose distribution at comparable stages of processing for a number of similarly processed batches of wafers. In this way normal system operation is established to serve as a reference for the currently processed batch and further, diagnostic data is accumulated for the correction of a present malfunction or for improvement of the elemental steps of the process.

In the present example the dose distribution itself is retained at milestone intervals where compensation is to be determined and the measured distribution is analyzed either contemporaneously or subsequently by comparison with the averaged set of nominally similar process histories. An abnormal condition is readily detected by the same general scheme as outlined above where the averaged histories are treated functionally as the model distribution above. A difference function should be uniform, symmetrically distributed about zero and of small (statistically defined) amplitude in order to establish that the present processing step represents no significant discrepancy with the averaged histories. Significant departure from the averaged histories is indicative of erratic behaviour but there is no essential requirement for terminating the processing in that instance because the invention is capable of correcting a wide variety of erratic conditions. Peculiar operation is flagged instead and routines are entered to ascertain whether the erratic behaviour is attributed to a readily identifiable source. For example, a beam current record accumulated during the corresponding interval can supply the necessary information to confirm whether the erratic result is attributable to a beam current fluctuation or whether the fault is of more subtle origin. This analysis obviously need not be contemporaneous with the batch processing when the objective is analysis and optimization of the process steps.

An alternative to the retention of the process measurement itself (here the dose array $D(x,y)$ is the retention of the compensatory function developed for performing the correction. The incremental difference between the remedial dose controlling function and the corresponding function prior to this compensation is a measure of the system performance deviation,. If this deviation is attributable to a recurring cause of whatever source, the process control function should be modified at the outset of processing to minimize the incremental difference function. The efficiency of the processing apparatus is improved if the control function, executed from the outset, contains such higher order approximations contributing to generation of the desired result (here $D(x,y) = M(x,y)$) with fewer compensatory steps.

It is apparent that the above described apparatus may be implemented with multiple processors. Merely by way of example, the comparison of the measured dose data with corresponding reference dose distribution data can be accomplished in a a separate processor to maintain a real time dose error function on a nearly continuous basis.

It is also a clearly feasible variation to transform the reference dose distribution to closely accord with the measured dose distribution conditions. In this way a considerable reduction may be achieved in computational load.

One skilled in the art will immediately recognize that many changes could be made in the above construction and many apparently widely differing embodiments of this invention could be made without departing from the scope thereof. Accordingly, it is intended that all matter contained in the above description or shown in the accompanying drawings shall be interpreted as illustrative only and not in a limiting sense.

What is claimed is:

1. An ion implantation system for irradiating a workpiece, comprising
    (a) charged particle accelerator means for producing a flux of energetic ions,
    (b) flux distributing means for directing the flux over said workpiece in accord with a preselected scanning pattern function to obtain a desired ion implantation treatment,
    (c) sensor means for deriving a flux magnitude signal proportional to the instantaneous magnitude of the flux incident on the workpiece wherein the instantaneous dose suffered by said workpiece is represented,
    (d) dose imaging means jointly cooperative with said sensor means and said flux distributing means for accumulating a record of the distribution of the differential cumulative magnitude of the flux incident on the workpiece as a function of coordinates on the surface of said workpiece, said record comprising a differential cumulative dose distribution function,
    (e) dose evaluation means operative upon the record of the differential cumulative dose distribution function to derive a corrected scanning pattern function for modifying said preselected scanning pattern function during said ion implantation treatment.

2. The ion implantation system of claim 1 wherein said dose imaging means further comprises means operative upon said flux magnitude signal for controlling the signal-to-noise ratio of the signal representative of said instantaneous dose.

3. The ion implantation system of claim 2 wherein said dose evaluation means comprises means for selecting a model dose distribution so as to define a desired dose distribution, means for comparing said model dose distribution and said differential cumulative dose distribution wherein a difference distribution is obtained, means operative upon said difference distribution and communicating with said flux distributing means to alter said pre-selected scanning pattern in accord with said difference distribution to cause said cumulative dose distribution function including increments to same as intercepted by said workpiece to converge toward said model dose distribution.

4. The system of claim 3 wherein said means for comparing determines a subtraction effected between said model distribution and cumulative dose distribution and the resulting difference represents a subtracted difference.

5. The system of claim 3 wherein said means for comparing forms a ratio between said model distribution and cumulative dose distribution and said difference represents a function of said ratio.

6. The system of claim 1 wherein said flux distributing means comprises mechanical means for introducing relative motion between said workpiece and said flux of energetic ions.

7. The system of claim 1 wherein said flux distributing means comprises deflection means for deflecting said flux in a direction substantially transverse to said flux.

8. A dose monitoring system for an irradiating apparatus comprising,
   (a) irradiating means for impinging a workpiece with a primary radiation flux of quantity sufficient to obtain a desired irradiation treatment,
   (b) sensor means for detecting a portion of the secondary radiation attending the impingement of primary radiation at a known surface portion of said workpiece, and generating an instantaneous dose increment signal proportional thereto,
   (c) dose imaging means for obtaining a dose accumulation record from said instantaneous dose increment signal from which a representation is constructed of the cumulative dose distribution over said known surface portion of the radiation dose suffered by said workpiece,
   (d) dose defect imaging means cooperatively disposed with said dose imaging means to compare said representation to a desired cumulative dose distribution to yield an error function expressing the result of the comparison during irradiation treatment by said irradiating means.

9. The system of claim 8 comprising analog-to-digital converter means operative upon said instantaneous dose increment signal to render same in digital form.

10. The system of claim 9 wherein said dose imaging means comprises memory means and cooperatively associated computational means for cumulating said record.

11. The system of claim 10 further comprising means for controllably distributing said radiation flux to selected area portions of said workpiece wherein each said selected area portion is identifiable concurrently with the corresponding instantaneous dose signal.

12. The dose monitoring system of claim 8 wherein the comparison is a difference of said representation and said desired cumulative dose distribution.

13. The dose monitoring system of claim 8 wherein the comparison is a ratio of said representation and said desired cumulative dose distribution.

14. A method for modifying the distribution of radiation dose intercepted over the surface of a workpiece, comprising the steps of
   (a) distributing a primary radiation flux at a predetermined rate over a predetermined pattern of coordinates of said surface at which coordinates said flux intercepts a surface portion of said workpiece,
   (b) causing the emission of a secondary radiation consequent to, and proportional to said primary radiation flux,
   (c) accumulating a portion of said secondary radiation as a function of said coordinates to establish a measured spatial distribution of radiation dose and,
   (d) comparing said measured distribution of the radiation dose with a preselected dose distribution shape at intervals during said step of distributing and altering said step of distributing to cause the distribution resulting from said altering of said distributing step or more nearly conform to the desired distribution, wherein said step of altering comprises modifying either said predetermined pattern or predetermined rate to cause said measured distribution to more closely approach said preselected dose distribution shape at a subsequent step of the comparison.

15. The method of claim 14 wherein said step of comparing comprises normalizing said measured dose distribution and said preselected distribution shape and obtaining a distribution function representative of the difference therebetween and constructing an error function from said difference distribution.

16. The method of claim 14 wherein said step of distributing comprises introducing a mechanical relative motion between said workpiece and said primary radiation flux, said motion substantially transverse to the direction of said flux.

17. The method of claim 14 wherein said step of distributing comprises deflecting said primary radiation flux in a direction substantially transverse to the direction of said flux.

18. A process of regulating the accumulated radiation dose received at a workpiece surface, comprising the steps of
   (a) controllably and repetitively irradiating portions of a workpiece with a primary radiation,
   (b) detecting a secondary radiation causally related to said step of irradiating and deriving a signal from said secondary radiation proportional to the instantaneous intensity of said primary radiation impinging one of said portions,
   (c) summing a measure of said signal with corresponding previous measures and retaining same, whereby a cumulative dose distribution is formed for each said portions,
   (d) comparing said cumulative dose distribution with a predetermined desired dose distribution to derive a dose error distribution and altering step (a) for subsequent repetitions thereof in accord with said dose distribution to converge said cumulative dose distribution to approach congruence with said desired dose distribution.

19. The process of claim 18 wherein said step of comparing comprises
   normalizing said cumulative dose distribution and said desired dose distribution,
   combining said distributions to obtain the difference distribution therebetween and
   reflecting said difference distribution about said desired dose distribution to obtain a weighting function.

20. The process of claim 19 wherein said step of altering comprises weighting subsequent irradiation of said workpiece by said weighting function.

21. The process of claim 19 wherein said step of combining comprises a subtraction between said desired and cumulative distributions.

22. The process of claim 19 wherein said step of combining comprises forming a ratio of said desired and cumulative distributions.

23. A semiconductor wafer to which a selected impurity has been controllably added through the steps of
   (a) producing a beam of said impurity,
   (b) distributing said beam over a surface of said wafer whereby the coordinates of the locus of the beam impingement on said wafer are identifiable,
   (c) measuring the quantity of impurity implanted at said locus in a discrete time interval and repeating said step of measuring for a plurality of loci thereby forming a measured spatial distribution function of the implanted spatial impurity over said surface,
   (d) determining a desired spatial distribution of impurity concentration, (e) summing the measurements acquired at step (c) to determine a cumulative measured spatial distribution concentration with said desired spatial distribution of impurity concentration, and deriving a relationship distribution function of the relationship therebetween,
(g) forming an error function from said relationship distribution and altering said step of distributing to reduce said relationship distribution to an acceptable difference whereby said semiconductor wafer is characterized by an implanted impurity spatially distributed close to a desired spatial distribution function.

* * * * *